United States Patent
Lu et al.

(10) Patent No.: US 11,764,810 B2
(45) Date of Patent: Sep. 19, 2023

(54) DECODING SYSTEM, DECODING CONTROLLER, AND DECODING CONTROL METHOD

(71) Applicant: Huawei Technologies Co., Ltd., Shenzhen (CN)

(72) Inventors: Qing Lu, Shenzhen (CN); Hong Chen, Chengdu (CN); Jun Chen, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/902,340

(22) Filed: Sep. 2, 2022

(65) Prior Publication Data
US 2022/0416814 A1    Dec. 29, 2022

Related U.S. Application Data

(63) Continuation of application No. PCT/CN2021/078397, filed on Mar. 1, 2021.

(30) Foreign Application Priority Data

Mar. 5, 2020    (CN) .......................... 202010150184.5

(51) Int. Cl.
*H03M 13/00* (2006.01)
*H03M 13/25* (2006.01)
(Continued)

(52) U.S. Cl.
CPC .......... *H03M 13/251* (2013.01); *G06F 7/523* (2013.01); *H03M 13/3933* (2013.01)

(58) Field of Classification Search
None
See application file for complete search history.

(56) References Cited

U.S. PATENT DOCUMENTS 8,239,728 B1 *  8/2012  Moon ................. H03M 13/251
                                                                714/755
8,719,670 B1 *  5/2014  Marrow ............. H03M 13/251
                                                                714/755
(Continued)

FOREIGN PATENT DOCUMENTS

CN    102075198 A    5/2011
CN    105052066 A    11/2015
(Continued)

OTHER PUBLICATIONS

Wang et al, "Design of a new LDPC decoder," Systems Engineering and Electronics, vol. 30 , No. 10, Oct. 30, 2008, 6 pages.
(Continued)

*Primary Examiner* — Mujtaba M Chaudry
(74) *Attorney, Agent, or Firm* — Slater Matsil, LLP

(57) ABSTRACT

A decoding system, a decoding controller, and a decoding control method are provided. In the decoding system, a decoding controller is disposed between two adjacent decoders. The decoding controller determines whether to perform turn-off based on a non-turn-off indication received by a previous-stage decoder, a turn-off indication output by the previous-stage decoder, and historical turn-off probability statistics. This is equivalent to adding a buffer zone between the two adjacent decoders.

20 Claims, 7 Drawing Sheets

(51) Int. Cl.
    *G06F 7/523*     (2006.01)
    *H03M 13/39*     (2006.01)

(56) References Cited

U.S. PATENT DOCUMENTS

| | | |
|---|---|---|
| 8,812,939 B2 | 8/2014 | Yang et al. |
| 10,498,362 B2 | 12/2019 | Hanham et al. |
| 2002/0196510 A1 | 12/2002 | Hietala et al. |
| 2013/0058642 A1 | 3/2013 | Bouda |
| 2015/0091742 A1* | 4/2015 | Ionita ............... H03M 5/18 341/57 |
| 2015/0092879 A1* | 4/2015 | Mansour ............ H03M 5/18 375/286 |
| 2015/0172689 A1 | 6/2015 | Annamraju et al. |
| 2016/0378595 A1* | 12/2016 | Rho ............... G06F 11/1048 714/764 |
| 2017/0257122 A1 | 9/2017 | Torii et al. |

FOREIGN PATENT DOCUMENTS

| | | |
|---|---|---|
| CN | 105531938 A | 4/2016 |
| CN | 106301389 A | 1/2017 |
| CN | 109117382 A | 1/2019 |
| CN | 110798283 A | 2/2020 |
| EP | 3331180 A1 | 6/2018 |
| JP | 2001197134 A | 7/2001 |
| WO | 2009069087 A1 | 6/2009 |
| WO | 2015139160 A1 | 9/2015 |

OTHER PUBLICATIONS

Wang et al, "Early Termination of BCH Codes Aided Iterative Decoding Algorithm for LDPC," Communications Technology, vol. 44, No. 232, Nov. 4, 2011, 3 pages.

\* cited by examiner

DECODING SYSTEM, DECODING CONTROLLER, AND DECODING CONTROL METHOD

CROSS-REFERENCE TO RELATED APPLICATIONS

This application is a continuation of International Application No. PCT/CN2021/078397, filed on Mar. 1, 2021, which claims priority to Chinese Patent Application No. 202010150184.5, filed on Mar. 5, 2020. The disclosures of the aforementioned applications are hereby incorporated by reference in their entireties.

TECHNICAL FIELD

This application relates to the field of communications technologies, and specifically, to a decoding system, a decoding controller, and a decoding control method.

BACKGROUND

Rapid development of new technologies such as cloud computing, big data, and the Internet of Things is accompanied with a rapid increase of Internet users and exponential growth of bandwidth requirements. This undoubtedly raises higher requirements on transmission performance and power consumption of an optical transmission system.

High requirements on the optical transmission system are mainly reflected by high requirements on a chip in the optical transmission system. In a decoding process of the optical transmission system, the chip usually works at a long-term stable working point, but when an optical channel status fluctuates, the working point of the chip fluctuates between the long-term stable working point and an extreme working point. The fluctuation of the working point of the chip causes relatively large fluctuation in power consumption, and excessive fluctuation in power consumption of the chip damages the chip.

SUMMARY

Embodiments of this application provide a decoding system, a decoding controller, and a decoding control method, to mitigate fluctuation in power consumption of a decoder (a chip of the decoder).

A first aspect of this application provides a decoding system, including at least two decoders, where a decoding controller is disposed between two adjacent decoders, and the two adjacent decoders include a first decoder and a second decoder; the first decoder receives a first indication and a first code block, where the first indication is used to indicate a non-turn-off state; when the first code block is successfully decoded, the first decoder generates a second indication used to indicate a turn-off state; the first decoder outputs the second indication and a second code block that is obtained after the first code block is successfully decoded; the decoding controller receives the first indication and the second indication; the decoding controller determines a first turn-off probability p based on the second indication and a quantity of second indications generated when the first decoder decodes code blocks preceding the first code block; the decoding controller determines a second turn-off probability p* based on the first turn-off probability p and a turn-off probability interval $\delta p$, where the turn-off probability interval $\delta p$ is obtained in advance by using a turn-off probability at a stable working point and a turn-off probability at an extreme working point; the decoding controller generates, based on the second turn-off probability p*, a third indication used to indicate the turn-off state or the non-turn-off state; and the second decoder receives the third indication and the second code block, and processes the second code block based on the third indication.

In the first aspect, the decoding system may be a forward error correction (FEC) decoding system, or may be another decoding system for iterative decoding. "Turn-off" in this embodiment of this application means that a decoder no longer performs a decoding operation on a received code block. The "non-turn-off state" is opposite to the "turn-off state". The non-turn-off state is used to indicate that the code block received by the decoder has not been successfully decoded, and the decoder needs to decode the received code block. The turn-off state is used to indicate that the code block received by the decoder has been successfully decoded by a previous decoder, and the received code block does not need to be decoded again. When the third indication indicates the non-turn-off state, the second decoder needs to decode the second code block again. In this case, an operation performed by the second decoder may be understood with reference to the first decoder. It can be learned from the first aspect that, after the first decoder determines that the first code block is successfully decoded, the decoding controller determines the second turn-off probability p* with reference to the first turn-off probability p and $\delta p$, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

In a possible implementation of the first aspect, the decoding controller includes a first statistics module and a second statistics module, where the first statistics module is configured to monitor outputting of the second code block by the first decoder, and add one on a basis of a quantity of second code blocks that are output after the first decoder decodes the code blocks preceding the first code block, to obtain a first accumulated value; and the second statistics module is configured to add one on a basis of the quantity of second indications generated when the first decoder decodes the code blocks preceding the first code block, to obtain a second accumulated value, and determine the first turn-off probability p based on the first accumulated value and the second accumulated value, where the second accumulated value is not greater than the first accumulated value.

In this possible implementation, a manner of calculating the first turn-off probability p and a manner of obtaining the first accumulated value and the second accumulated value related to calculation of p are provided, so that fast calculation of p is implemented.

In a possible implementation of the first aspect, the first statistics module includes a first accumulator and a first buffer, where the first buffer is configured to buffer the quantity of second code blocks; the first accumulator is configured to add one on a basis of the quantity of second code blocks buffered in the first buffer, to obtain the first accumulated value; and the first buffer is configured to update the quantity of second code blocks by using the first accumulated value.

In this possible implementation, a process of calculating the first accumulated value and updating the buffer in a circuit manner is provided, and diversified implementations are provided for determining the first accumulated value.

In a possible implementation of the first aspect, the second statistics module includes a second accumulator, a second buffer, and a multiplier, where the second buffer is configured to buffer the quantity of second indications; the second accumulator is configured to add one on a basis of the quantity of second indications buffered in the second buffer, to obtain the second accumulated value; the second buffer is configured to update the quantity of second indications by using the second accumulated value; and the multiplier is configured to divide the second accumulated value by the first accumulated value to obtain the first turn-off probability p.

In this possible implementation, a process of calculating the second accumulated value, updating the buffer, and calculating the first turn-off probability p in the circuit manner is provided, and diversified implementations are provided for calculating the second accumulated value and calculating the first turn-off probability p.

In a possible implementation of the first aspect, the decoding controller further includes a decider and a turn-off probability calculator, where the decider is configured to determine, based on the first accumulated value obtained by the first accumulator, whether a time window is reached; and the turn-off probability calculator is configured to determine the second turn-off probability p* based on the first turn-off probability p and the turn-off probability interval δp when the decider determines that the time window is reached.

In this possible implementation, the time window refers to a time periodicity. For example, one minute is a time window, and a specific time length of the time window may be set based on a requirement. In addition, in this possible implementation, the time window is determined in the circuit manner, calculation of the second turn-off probability p* is implemented in the circuit manner, and diversified implementations are provided for determining the time window and calculating p*.

In a possible implementation of the first aspect, when the decider determines that the time window is reached, the turn-off probability calculator is specifically configured to determine, based on a threshold range of the first turn-off probability p, a relational expression between p and δp corresponding to the second turn-off probability p*, and determine, based on the relational expression, the second turn-off probability p* corresponding to the first turn-off probability p.

In this possible implementation, p* is calculated in a relational expression manner, so that a speed of calculating p* can be increased.

In a possible implementation of the first aspect, the decoding controller further includes a probability buffer, where the probability buffer is configured to buffer the second turn-off probability p* in the time window.

In this possible implementation, the probability buffer may use p* to determine the time window, and p* does not need to be frequently updated. This reduces energy consumption of the decoding controller and improves stability of the decoding system.

In a possible implementation of the first aspect, the decoding controller further includes a comparator and a selector, where the comparator is configured to compare the second turn-off probability p* with a random number; and the selector is configured to: when the comparator compares that p* is greater than the random number, generate the third indication used to indicate the turn-off state, or when the comparator compares that p* is less than the random number, generate the third indication used to indicate the non-turn-off state.

In this possible implementation, the random number is a number randomly generated by the comparator, and a value of the random number in this application ranges from 0 to 1. Alternatively, the random number in the comparator may be a random number sequence preconfigured and randomly selected by the comparator. Alternatively, a random number generation rule may be preconfigured in the comparator, and the comparator randomly generates the random number. The third indication used to indicate the turn-off state is output only when the probability p* is greater than the random number. This avoids rapid fluctuation caused by immediate turn-off of the second decoder when the first decoder outputs the second indication used to indicate the turn-off state, and effectively mitigates fluctuation in power consumption of the decoder (the chip of the decoder). In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

A second aspect of this application provides a decoding controller, applied to a decoding system, where the decoding system includes at least two decoders, a decoding controller is disposed between two adjacent decoders, the two adjacent decoders include a first decoder and a second decoder, and the decoding controller includes a receiving unit, a statistics unit, a probability calculation unit, an indication generation unit, and a sending unit, where the receiving unit is configured to receive a first indication and a second indication, where the first indication is used to indicate a non-turn-off state, the second indication is generated when the first decoder successfully decodes a first code block, and the second indication is used to indicate a turn-off state; the statistics unit determines a first turn-off probability p based on the second indication and a quantity of second indications generated when the first decoder decodes code blocks preceding the first code block; the probability calculation unit determines a second turn-off probability p* based on the first turn-off probability p and a turn-off probability interval δp, where the turn-off probability interval δp is obtained in advance by using a turn-off probability at a stable working point and a turn-off probability at an extreme working point; the indication generation unit generates, based on the second turn-off probability p*, a third indication used to indicate the turn-off state or the non-turn-off state; and the sending unit is configured to send the third indication, where the third indication is used by the second decoder to process the second code block.

In the second aspect, the decoding system may be an FEC decoding system, or may be another decoding system for iterative decoding. "Turn-off" in this embodiment of this application means that a decoder no longer performs a decoding operation on a received code block. The "non-turn-off state" is opposite to the "turn-off state". The non-turn-off state is used to indicate that the code block received by the decoder has not been successfully decoded, and the decoder needs to decode the received code block. The turn-off state is used to indicate that the code block received by the decoder has been successfully decoded by a previous decoder, and the received code block does not need to be decoded again. When the third indication indicates the non-turn-off state, the second decoder needs to decode the second code block again. In this case, an operation performed by the second decoder may be understood with reference to the first decoder. It can be learned from the second aspect that, after the first decoder determines that the first code block is successfully decoded, the decoding controller determines the second turn-off probability p* with reference to the first turn-off probability p and δp, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

In a possible implementation of the second aspect, the statistics unit includes a first statistics module and a second statistics module, where the first statistics module is configured to monitor outputting of the second code block by the first decoder, and add one on a basis of a quantity of second code blocks that are output after the first decoder decodes the code blocks preceding the first code block, to obtain a first accumulated value; and the second statistics module is configured to add one on a basis of the quantity of second indications generated when the first decoder decodes the code blocks preceding the first code block, to obtain a second accumulated value, and determine the first turn-off probability p based on the first accumulated value and the second accumulated value, where the second accumulated value is not greater than the first accumulated value.

In this possible implementation, a manner of calculating the first turn-off probability p and a manner of obtaining the first accumulated value and the second accumulated value related to calculation of p are provided, so that fast calculation of p is implemented.

In a possible implementation of the second aspect, the first statistics module includes a first accumulator and a first buffer, where the first buffer is configured to buffer the quantity of second code blocks; the first accumulator is configured to add one on a basis of the quantity of second code blocks buffered in the first buffer, to obtain the first accumulated value; and the first buffer is configured to update the quantity of second code blocks by using the first accumulated value.

In this possible implementation, a process of calculating the first accumulated value and updating the buffer in a circuit manner is provided, and diversified implementations are provided for determining the first accumulated value.

In a possible implementation of the second aspect, the second statistics module includes a second accumulator, a second buffer, and a multiplier, where the second buffer is configured to buffer the quantity of second indications; the second accumulator is configured to add one on a basis of the quantity of second indications buffered in the second buffer, to obtain the second accumulated value; the second buffer is configured to update the quantity of second indications by using the second accumulated value; and the multiplier is configured to divide the second accumulated value by the first accumulated value to obtain the first turn-off probability p.

In this possible implementation, a process of calculating the second accumulated value, updating the buffer, and calculating the first turn-off probability p in the circuit manner is provided, and diversified implementations are provided for calculating the second accumulated value and calculating the first turn-off probability p.

In a possible implementation of the second aspect, the statistics unit further includes a decider, and the probability calculation unit includes a turn-off probability calculator, where the decider is configured to determine, based on the first accumulated value obtained by the first accumulator, whether a time window is reached; and the turn-off probability calculator is configured to determine the second turn-off probability p* based on the first turn-off probability p and the turn-off probability interval δp when the decider determines that the time window is reached.

In this possible implementation, the time window refers to a time periodicity. For example, one minute is a time window, and a specific time length of the time window may be set based on a requirement. In addition, in this possible implementation, the time window is determined in the circuit manner, calculation of the second turn-off probability p* is implemented in the circuit manner, and diversified implementations are provided for determining the time window and calculating p*.

In a possible implementation of the second aspect, when the decider determines that the time window is reached, the turn-off probability calculator is specifically configured to determine, based on a threshold range of the first turn-off probability p, a relational expression between p and δp corresponding to the second turn-off probability p*, and determine, based on the relational expression, the second turn-off probability p* corresponding to the first turn-off probability p.

In this possible implementation, p* is calculated in a relational expression manner, so that a speed of calculating p* can be increased.

In a possible implementation of the second aspect, the decoding controller further includes a probability buffer, where the probability buffer is configured to buffer the second turn-off probability p* in the time window.

In this possible implementation, the probability buffer may use p* to determine the time window, and p* does not need to be frequently updated. This reduces energy consumption of the decoding controller and improves stability of the decoding system.

In a possible implementation of the second aspect, the indication generation unit includes a comparator and a selector, where the comparator is configured to compare the second turn-off probability p* with a random number; and the selector is configured to: when the comparator compares that p* is greater than the random number, generate the third indication used to indicate the turn-off state, or when the comparator compares that p* is less than the random number, generate the third indication used to indicate the non-turn-off state.

In this possible implementation, the random number is a number randomly generated by the comparator, and a value of the random number in this application ranges from 0 to 1. Alternatively, the random number in the comparator may be a random number sequence preconfigured and randomly selected by the comparator. Alternatively, a random number generation rule may be preconfigured in the comparator, and the comparator randomly generates the random number. The third indication used to indicate the turn-off state is output only when the probability p* is greater than the random number. This avoids rapid fluctuation caused by immediate turn-off of the second decoder when the first decoder outputs the second indication used to indicate the turn-off state, and effectively mitigates fluctuation in power consumption of the decoder (the chip of the decoder). In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

A third aspect of this application provides a decoding control method, where the method is applied to a decoding system, the decoding system includes at least two decoders, a decoding controller is disposed between two adjacent decoders, the two adjacent decoders include a first decoder and a second decoder, and the method includes the following steps: The decoding controller receives a first indication and a second indication, where the first indication is used to indicate a non-turn-off state, the second indication is generated when the first decoder successfully decodes a first code block, and the second indication is used to indicate a turn-off state; the decoding controller determines a first turn-off probability p based on the second indication and a quantity of second indications generated when the first decoder decodes code blocks preceding the first code block; the decoding controller determines a second turn-off probability p* based on the first turn-off probability p and a turn-off probability interval δp, where the turn-off probability interval δp is obtained in advance by using a turn-off probability at a stable working point and a turn-off probability at an extreme working point; the decoding controller generates, based on the second turn-off probability p*, a third indication used to indicate the turn-off state or the non-turn-off state; and the decoding controller sends the third indication, where the third indication is used by the second decoder to process the second code block.

In the third aspect, the decoding system may be an FEC decoding system, or may be another decoding system for iterative decoding. "Turn-off" in this embodiment of this application means that a decoder no longer performs a decoding operation on a received code block. The "non-turn-off state" is opposite to the "turn-off state". The non-turn-off state is used to indicate that the code block received by the decoder has not been successfully decoded, and the decoder needs to decode the received code block. The turn-off state is used to indicate that the code block received by the decoder has been successfully decoded by a previous decoder, and the received code block does not need to be decoded again. When the third indication indicates the turn-off state, that the second decoder processes the second code block based on the third indication may be that the second decoder transparently transmits the second code block. Transparent transmission means that the decoder does not need to process the received code block, but only needs to transmit the received code block to a next-stage decoder. When the third indication indicates the non-turn-off state, the second decoder needs to decode the second code block again. In this case, an operation performed by the second decoder may be understood with reference to the first decoder. It can be learned from the third aspect that, after the first decoder determines that the first code block is successfully decoded, the decoding controller determines the second turn-off probability p* with reference to the first turn-off probability p and δp, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

In a possible implementation of the third aspect, the decoding controller determines the first turn-off probability p based on the second indication and the quantity of second indications generated when the first decoder decodes the code blocks preceding the first code block; the decoding controller monitors outputting of the second code block by the first decoder, and adds one on a basis of a quantity of second code blocks that are output after the first decoder decodes the code blocks preceding the first code block, to obtain a first accumulated value; and the decoding controller adds one on a basis of the quantity of second indications generated when the first decoder decodes the code blocks preceding the first code block, to obtain a second accumulated value, and determines the first turn-off probability p based on the first accumulated value and the second accumulated value, where the second accumulated value is not greater than the first accumulated value.

In this possible implementation, a manner of calculating the first turn-off probability p and a manner of obtaining the first accumulated value and the second accumulated value related to calculation of p are provided, so that fast calculation of p is implemented.

In a possible implementation of the third aspect, the method further includes: The decoding controller updates the quantity of second code blocks by using the first accumulated value.

In this possible implementation, updating the quantity of second code blocks in time can ensure that the first accumulated value can also be quickly calculated next time.

In a possible implementation of the third aspect, the method further includes: The decoding controller updates the quantity of second indications by using the second accumulated value.

In this possible implementation, updating the quantity of second indications in time can ensure that the second accumulated value can also be quickly calculated next time.

In a possible implementation of the third aspect, the method further includes: The decoding controller determines, based on the first accumulated value, whether a time window is reached; and that the decoding controller determines a second turn-off probability p* based on the first turn-off probability p and a turn-off probability interval δp includes: The decoding controller determines the second turn-off probability p* based on the first turn-off probability p and the turn-off probability interval δp when determining that the time window is reached.

In this possible implementation, the time window refers to a time periodicity. For example, one minute is a time window, and a specific time length of the time window may be set based on a requirement.

In a possible implementation of the third aspect, the step in which the decoding controller determines the second turn-off probability p* based on the first turn-off probability p and the turn-off probability interval δp when determining that the time window is reached includes: When determining that the time window is reached, the decoding controller determines, based on a threshold range of the first turn-off probability p, a relational expression between p and δp corresponding to the second turn-off probability p*, and determines, based on the relational expression, the second turn-off probability p* corresponding to the first turn-off probability p.

In this possible implementation, p* is calculated in a relational expression manner, so that a speed of calculating p* can be increased.

In a possible implementation of the third aspect, the method further includes: The decoding controller buffers the second turn-off probability p* in the time window.

In this possible implementation, the probability buffer may use p* to determine the time window, and p* does not need to be frequently updated. This reduces energy consumption of the decoding controller and improves stability of the decoding system.

In a possible implementation of the third aspect, the step in which the decoding controller generates, based on the second turn-off probability p*, the third indication used to indicate the turn-off state or the non-turn-off state includes: The decoding controller compares the second turn-off probability p* with a random number; and when comparing that p* is greater than the random number, the decoding controller generates the third indication used to indicate the turn-off state, or when comparing that p* is less than the random number, generates the third indication used to indicate the non-turn-off state.

In this possible implementation, the random number is a number randomly generated by the comparator, and a value of the random number in this application ranges from 0 to 1. Alternatively, the random number in the comparator may be a random number sequence preconfigured and randomly selected by the comparator. Alternatively, a random number generation rule may be preconfigured in the comparator, and the comparator randomly generates the random number. The third indication used to indicate the turn-off state is output only when the probability p* is greater than the random number. This avoids rapid fluctuation caused by immediate turn-off of the second decoder when the first decoder outputs the second indication used to indicate the turn-off state, and effectively mitigates fluctuation in power consumption of the decoder (the chip of the decoder). In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

A fourth aspect of this application provides a decoding controller, where the decoding controller is applied to a decoding system, the decoding system includes at least two decoders, a decoding controller is disposed between two adjacent decoders, the two adjacent decoders include a first decoder and a second decoder, and the decoding controller includes: a receiving unit, configured to receive a first indication and a second indication, where the first indication is used to indicate a non-turn-off state, the second indication is generated when the first decoder successfully decodes a first code block, and the second indication is used to indicate a turn-off state; a processing unit, configured to determine a first turn-off probability p based on the second indication and a quantity of second indications generated when the first decoder decodes code blocks preceding the first code block, determine a second turn-off probability p* based on the first turn-off probability p and a turn-off probability interval δp, where the turn-off probability interval δp is obtained in advance by using a turn-off probability at a stable working point and a turn-off probability at an extreme working point, and generate, based on the second turn-off probability p*, a third indication used to indicate the turn-off state or the non-turn-off state; and a sending unit, configured to send the third indication, where the third indication is used by the second decoder to process the second code block.

In a possible implementation of the fourth aspect, the processing unit is configured to: monitor outputting of the second code block by the first decoder, and add one on a basis of a quantity of second code blocks that are output after the first decoder decodes the code blocks preceding the first code block, to obtain a first accumulated value; and add one on a basis of the quantity of second indications generated when the first decoder decodes the code blocks preceding the first code block, to obtain a second accumulated value, and determine the first turn-off probability p based on the first accumulated value and the second accumulated value, where the second accumulated value is not greater than the first accumulated value.

In a possible implementation of the fourth aspect, the processing unit is further configured to update the quantity of second code blocks by using the first accumulated value.

In a possible implementation of the fourth aspect, the processing unit is further configured to update the quantity of second indications by using the second accumulated value.

In a possible implementation of the fourth aspect, the processing unit is further configured to determine, based on the first accumulated value, whether a time window is reached; and determine the second turn-off probability p* based on the first turn-off probability p and the turn-off probability interval δp when determining that the time window is reached.

In a possible implementation of the fourth aspect, when determining that the time window is reached, the processing unit is configured to determine, based on a threshold range of the first turn-off probability p, a relational expression between p and δp corresponding to the second turn-off probability p*, and determine, based on the relational expression, the second turn-off probability p* corresponding to the first turn-off probability p.

In a possible implementation of the fourth aspect, the decoding controller further includes a storage unit, configured to buffer the second turn-off probability p* in the time window.

In a possible implementation of the fourth aspect, the processing unit is configured to: compare the second turn-off probability p* with a random number; and when comparing that p* is greater than the random number, generate the third indication used to indicate the turn-off state, or when comparing that p* is less than the random number, generate the third indication used to indicate the non-turn-off state.

A fifth aspect of this application provides a decoding controller, where the decoding controller includes at least one processor, a memory, and a communications interface. The processor is coupled to the memory and the communications interface. The memory is configured to store instructions, the processor is configured to execute the instructions, and the communications interface is configured to communicate with another network element under control of the processor. When the instructions are executed by the processor, the processor is enabled to perform the method in any one of the third aspect or the possible implementations of the third aspect.

A sixth aspect of this application provides a computer-readable storage medium, where the computer-readable storage medium stores a program, and the program enables a decoding controller to perform the method in any one of the third aspect or the possible implementations of the third aspect.

A seventh aspect of this application provides a computer program product. The computer program product includes computer-executable instructions, and the computer-executable instructions are stored in a computer-readable storage medium. At least one processor of a device can read the computer-executable instructions from the computer-readable storage medium, and the at least one processor executes the computer-executable instructions, so that the device implements the method provided in any one of the third aspect or the possible implementations of the third aspect.

An eighth aspect of this application provides a system-on-chip, where the system-on-chip includes a processor configured to support a decoding controller in implementing functions in any one of the third aspect or the possible implementations of the third aspect. In a possible design, the system-on-chip may further include a memory, where the memory is configured to store program instructions and data required by the decoding controller. The system-on-chip may include a chip, or may include a chip and another discrete component.

For technical effects brought by any one of the fourth aspect to the eighth aspect or the possible implementations thereof, refer to technical effects brought by the third aspect or different possible implementations of the third aspect. Details are not described herein again.

In the solutions provided in embodiments of this application, after the first decoder determines that the first code block is successfully decoded, the decoding controller determines the second turn-off probability p* with reference to the first turn-off probability p and δp, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

DETAILED DESCRIPTION OF ILLUSTRATIVE EMBODIMENTS

The following describes embodiments of this application with reference to accompanying drawings. It is clear that the described embodiments are merely some rather than all of embodiments of this application. A person of ordinary skill in the art may learn that, with development of technologies and emergence of new scenarios, technical solutions provided in embodiments of this application are also applicable to similar technical problems.

In the specification, claims, and the accompanying drawings of this application, the terms "first", "second", and the like are intended to distinguish between similar objects but do not necessarily indicate a specific order or sequence. It should be understood that data termed in such a way is interchangeable in proper circumstances, so that embodiments described herein can be implemented in other orders than the order illustrated or described herein. Moreover, the terms "include", "contain" and any variant thereof mean to cover non-exclusive inclusion. For example, a process, method, system, product, or device that includes a list of steps or units is not necessarily limited to those expressly listed steps or units, but may include other steps or units that are not expressly listed or inherent to the process, method, product, or device.

Embodiments of this application provide a decoding system, a decoding controller, and a decoding control method, to mitigate fluctuation in power consumption of a chip of a decoder. The following separately provides detailed descriptions.

The decoding system provided in embodiments of this application may be applied to an optical communications system, an electrical communications system, a wireless communications system, or the like. The optical communications system is used as an example. The optical communications system may be a coherent optical communications system or an intensity modulation-direct detection (IM-DD) system.

Using the coherent optical communications system as an example, the following describes the application of the decoding system provided in embodiments of this application. The decoding system provided in embodiments of this application is applied to a signal receiving device in the coherent optical communications system. The following describes the signal receiving device in the coherent optical communications system by using FIG. 1 as an example.

Figure 1:
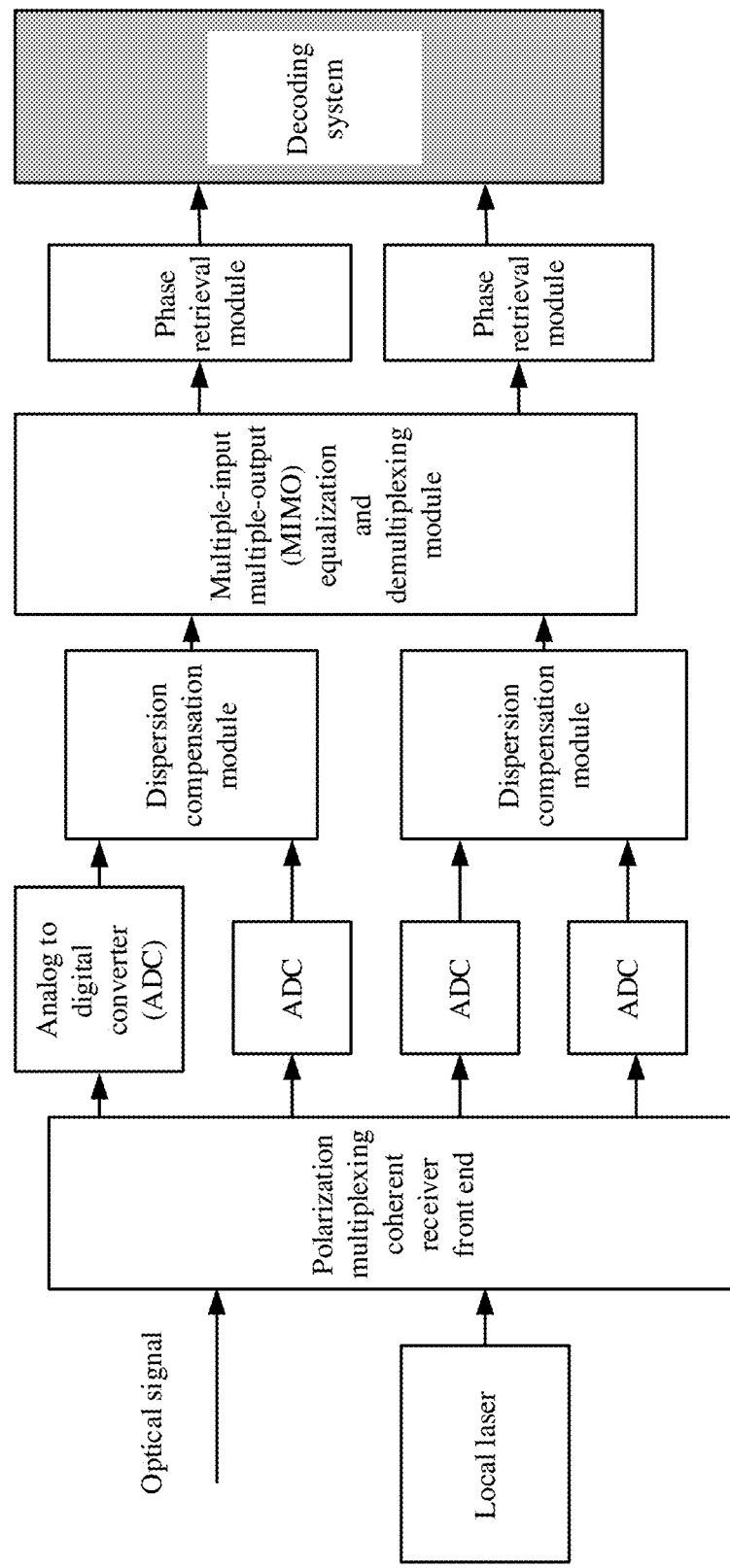
FIG. 1 is a schematic diagram of a structure of a signal receiving device in a coherent optical communications system.

FIG. 1 is a schematic diagram of a structure of a signal receiving device in a coherent optical communications system. As shown in FIG. 1, the signal receiving device in the coherent optical communications system may include a local laser, a polarization multiplexing coherent receiver front end, analog to digital converters (ADCs), dispersion compensation modules, a multiple-input multiple-output (Multiple-Input Multiple-Output, MIMO) equalization and demultiplexing module, phase retrieval modules, and a decoding system.

The polarization multiplexing coherent receiver front end receives an optical signal and a local oscillator signal generated by the local laser. The polarization multiplexing coherent receiver front end converts the optical signal into four analog electrical signals. Four ADCs convert the four analog electrical signals into digital signals respectively, and then every two digital signals are input to one dispersion compensation module for dispersion compensation. Dispersion-compensated signals output by the dispersion compensation modules are separately input to the MIMO equalization and demultiplexing module for polarization demultiplexing and equalization. The MIMO equalization and demultiplexing module inputs equalized and demultiplexed signals to the phase retrieval modules for phase retrieval. Two signals after phase retrieval are sent to the decoding system in a data interpolation manner, so that original data of a transmit end is retrieved. The data interpolation manner means that code blocks in the two signals are sent into the decoding system in sequence. The original data retrieved by the signal receiving device may alternatively include one signal. In this case, data interpolation may not need to be performed on the code block input to the decoding system. The decoding system may be a forward error correction (FEC) decoding system, or may be another decoding system for iterative decoding.

Figure 2:
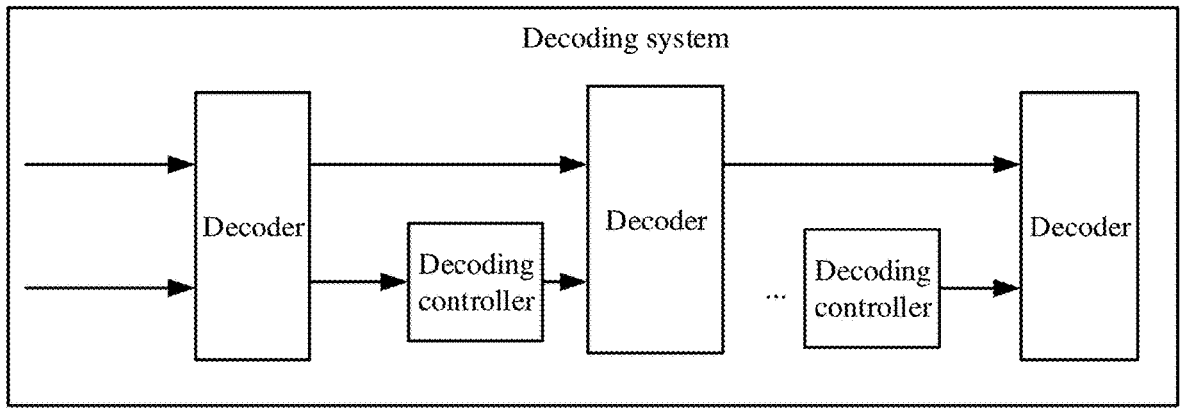
FIG. 2 is a schematic diagram of a structure of a decoding system according to an embodiment of this application.

FIG. 2 is a schematic diagram of a structure of a decoding system according to an embodiment of this application. The decoding system provided in the embodiment of this application in FIG. 1 may be understood with reference to FIG. 2. As shown in FIG. 2, the decoding system includes at least two decoders, and a decoding controller is disposed between two adjacent decoders. In the decoding system shown in FIG. 2, two adjacent decoders and a decoding controller between the two decoders are used as an example, and related operating principles of components are described with reference to FIG. 3.

Figure 3:
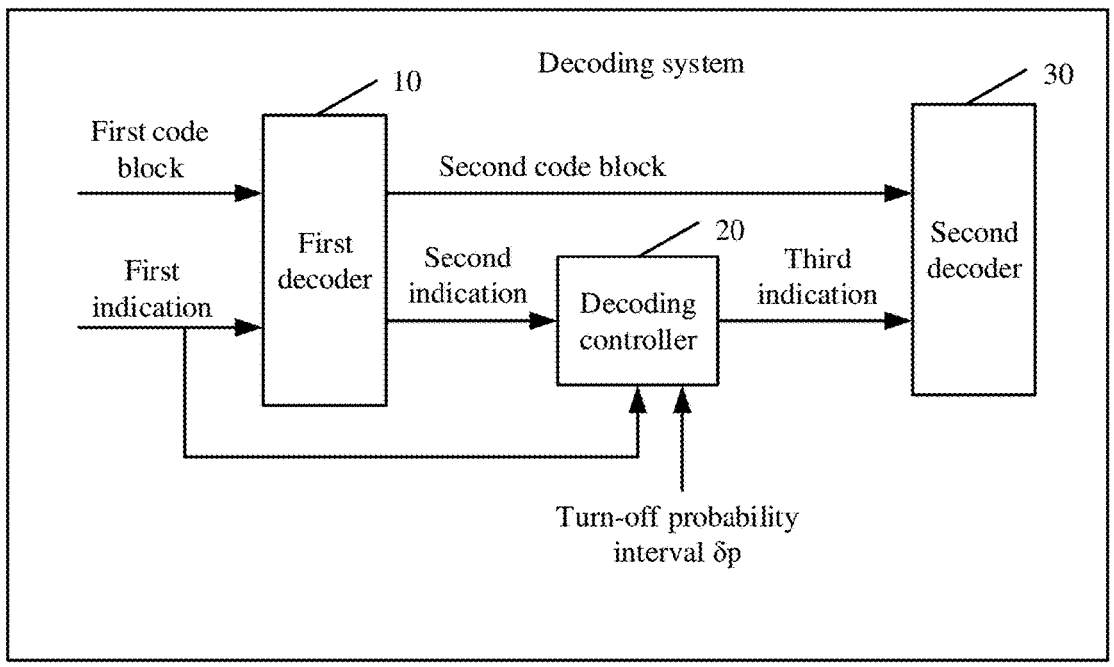
FIG. 3 is a schematic diagram of another structure of a decoding system according to an embodiment of this application.

FIG. 3 is a schematic diagram of another structure of a decoding system according to an embodiment of this application. As shown in FIG. 3, two adjacent decoders in the decoding system provided in this embodiment of this application include a first decoder 10 and a second decoder 30, and a decoding controller 20 is included between the first decoder and the second decoder.

The first decoder 10 receives a first indication and a first code block.

In one case, if the first indication indicates a turn-off state, the first decoder does not need to decode the first code block, but directly transparently transmits the first code block. Transparent transmission means that the decoder does not need to process the received code block, but only needs to transmit the received code block to a next-stage decoder.

In another case, if the first indication indicates a non-turn-off state, the first indication is used to indicate the first decoder 10 to decode the first code block. The first decoder 10 decodes the first code block to obtain a second code block. After the decoding, the first decoder 10 verifies whether the decoding is successful. A verification manner may be that the first decoder 10 determines, based on a check constraint relationship between code blocks and confidence information, whether an iteration is further required for the code block. If an iteration is further required, it indicates that the decoding by the first decoder 10 fails, and the second decoder 30 further needs to continue to decode the second code block. If no iteration is required, it indicates that the decoding by the first decoder 10 is successful, and the second decoder 30 does not need to decode the second code block again. Whether the decoding is successful is further verified by checking a matrix H×code block C. If H×C≠0, it indicates that the decoding by the first decoder 10 fails, and the second decoder 30 further needs to continue to decode the second code block. In this case, the first decoder may generate an indication of the non-turn-off state, and directly send the indication of the non-turn-off state to the second decoder for next-stage decoding. If H×C=0, it indicates that the decoding by the first decoder 10 is successful, and the second decoder 30 does not need to decode the second code block again. When the decoding by the first decoder 10 is successful, the first decoder 10 generates a second indication used to indicate the turn-off state. The first decoder 10 outputs the second indication and the second code block that is obtained after the first code block is successfully decoded.

The decoding controller 20 receives the first indication and the second indication, and then determines a first turn-off probability p based on the second indication and a quantity of second indications generated when the first decoder decodes code blocks preceding the first code block. Further the decoding controller 20 determines a second turn-off probability p* based on the first turn-off probability p and a turn-off probability interval δp, where the turn-off probability interval δp is obtained in advance by using a turn-off probability at a stable working point and a turn-off probability at an extreme working point. The decoding controller 20 generates, based on the second turn-off probability p*, a third indication used to indicate the turn-off state or the non-turn-off state, and then the decoding controller 20 sends the third indication.

The second decoder 30 receives the third indication and the second code block, and processes the second code block based on the third indication. When the third indication is used to indicate different states, manners of processing the second code block by the second decoder are also different.

In one case, when the third indication indicates the turn-off state, the second decoder 30 transparently transmits the second code block.

In another case, when the third indication indicates the non-turn-off state, the second decoder 30 needs to decode the second code block again. In this case, an operation performed by the second decoder 30 may be understood with reference to the first decoder 10.

It should be noted that "turn-off" in this embodiment of this application means that a decoder no longer performs a decoding operation on a received code block. The "non-turn-off state" is opposite to the "turn-off state". The non-turn-off state is used to indicate that the code block received by the decoder has not been successfully decoded, and the decoder needs to decode the received code block. The turn-off state is used to indicate that the code block received by the decoder has been successfully decoded by a previous decoder, and the received code block does not need to be decoded again. The "non-turn-off state" and "turn-off state" may be indicated in binary notation. For example, 0 is used to indicate the "non-turn-off state" and 1 is used to indicate the "turn-off state". Certainly, without limitation, the states may be indicated by using other characters than 0 and 1. For example, F is used to indicate the "non-turn-off state", and T is used to indicate the "turn-off state". Alternatively, other forms may be used to indicate the two states. Using 0 and 1 as an example, the first indication may be 0, the second indication may be 1, and the third indication may be 1 or 0.

Every time a code block is decoded successfully, the first decoder 10 generates a second indication for the decoded code block. The first turn-off probability p indicates a probability of successful decoding by the first decoder 10. For example, if the first decoder 10 successively decodes 10 code blocks, and six of the code blocks are successfully decoded, six second indications used to indicate the turn-off state are generated successively. For the other four code blocks that fail to be decoded, indications used to indicate the non-turn-off state are generated. In this case, a proportion of indications indicating the turn-off state is 0.6, and the first turn-off probability p in this example is 0.6. The turn-off probability interval δp indicates a turn-off probability at each time of decoding when the decoder jumps between the stable working point and the extreme working point, and can be represented by using the following expression: δp=(Turn-off probability at the stable working point−Turn-off probability at the extreme working point)/Number of times of decoding. The extreme working point refers to a state in which the decoder needs to consume extremely high power for channel fluctuation to ensure decoding when channel fluctuation occurs. In this case, usually, no power headroom for potential channel fluctuation is reserved from transmit power used by a transmitting device in signal transmission in the communications system in which the decoding system is located (that is, the reserved power headroom is 0 dB). Therefore, when a decoder located on a receiving device receives a to-be-decoded code block, to ensure decoding, the decoder needs to overcome impact caused by channel fluctuation and consume power of the decoder itself to meet a decoding requirement. Moreover, in this case, even if normal decoding can be ensured, a relatively good communication service still cannot be provided. The stable working point refers to a state in which the decoder can implement decoding without consuming additional power for channel fluctuation when channel fluctuation occurs. In this case, usually, power headroom for potential channel fluctuation is reserved from the transmit power used by the transmitting device in signal transmission in the communications system in which the decoding system is located (usually, the reserved power headroom is 1.5 dB). Therefore, when the decoder located on the receiving device receives the to-be-decoded code block, even if there is channel fluctuation, the power headroom reserved by the transmitting device can compensate, and the decoder does not need to consume power of the decoder itself for channel fluctuation. Moreover, usually, in this case, a relatively good communication service can be provided. In the foregoing relational expression, the turn-off probability at the stable working point and the turn-off probability at the extreme working point can be obtained in a plurality of manners. For example, the turn-off probability at the extreme working point and the turn-off probability at the stable working point can be obtained respectively by performing a plurality of experiments at the extreme working point and the stable working point (for example, performing 100 or more experiments respectively), or the turn-off probability at the stable working point and the turn-off probability at the extreme working point can be obtained by tracking and recording a best turn-off probability and a worst turn-off probability.

It can be learned from the working process of the foregoing decoding system that, after the first decoder determines that the first code block is successfully decoded, the decoding controller determines the second turn-off probability p* with reference to the first turn-off probability p and δp, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

An operating principle of the decoding controller in FIG. 3 may be implemented in a circuit manner, or may be implemented in a software manner. The following provides descriptions separately.

I. Solution Implemented in the Circuit Manner.

Figure 4:
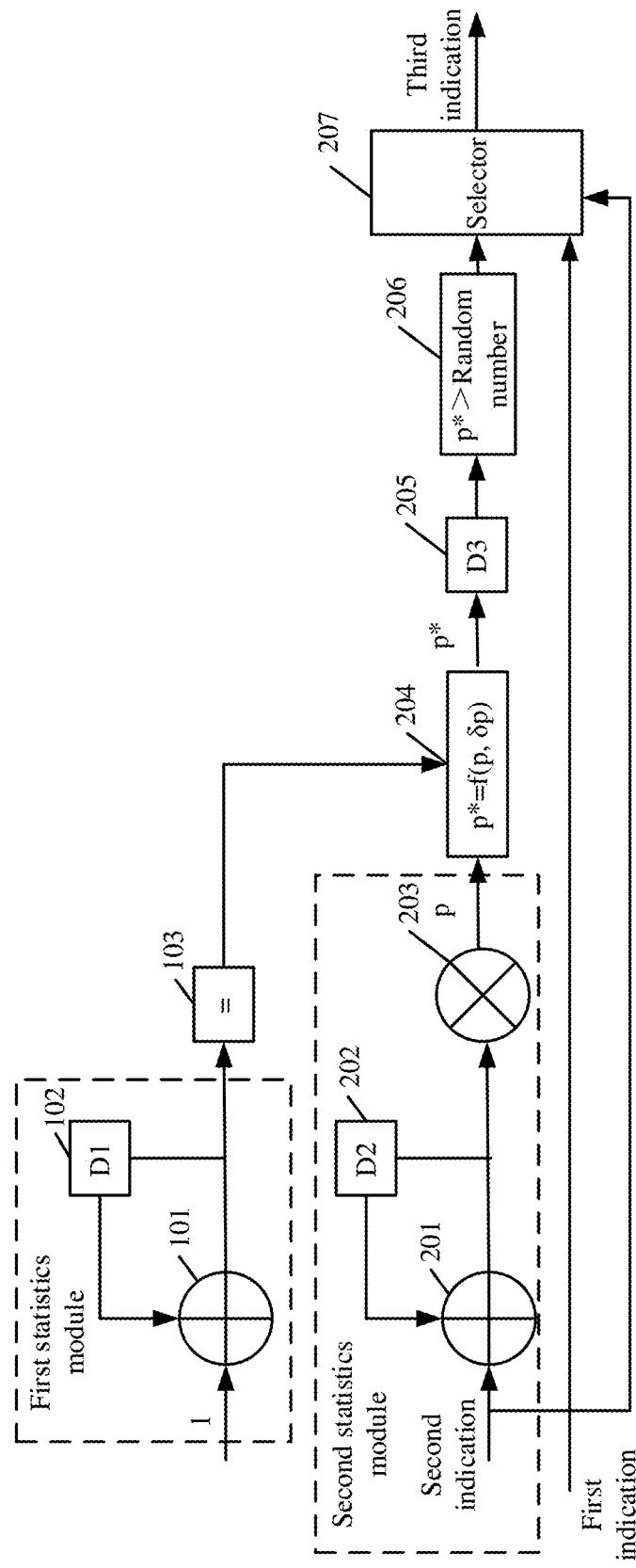
FIG. 4 is a schematic diagram of a structure of a decoding controller according to an embodiment of this application.

FIG. 4 is a schematic diagram of a structure of the decoding controller according to this embodiment of this application. As shown in FIG. 4, the decoding controller may include a first statistics module and a second statistics module. The first statistics module may include a first accumulator 101 and a first buffer (D1) 102. The second statistics module includes a second accumulator 201, a second buffer (D2) 202, and a multiplier 203. The decoding controller may further include a decider 103, a turn-off probability calculator 204, a probability buffer (D3) 205, a comparator 206, and a selector 207.

The first statistics module is configured to monitor outputting of the second code block by the first decoder, and add one on a basis of a quantity of second code blocks that are output after the first decoder decodes the code blocks preceding the first code block, to obtain a first accumulated value.

The second statistics module is configured to add one on a basis of the quantity of second indications generated when the first decoder decodes the code blocks preceding the first code block, to obtain a second accumulated value, and determine the first turn-off probability p based on the first accumulated value and the second accumulated value, where the second accumulated value is not greater than the first accumulated value.

Specifically, the first buffer (D1) 102 is configured to buffer the quantity of second code blocks that are output after the first decoder decodes the code blocks preceding the first code block. The first code block may be a continuous code block stream. Before decoding the current first code block, the first decoder may continuously receive and decode a plurality of code blocks. For example, if the first decoder has decoded the code blocks preceding the first code block and output nine second code blocks, the quantity of second code blocks buffered in the first buffer (D1) 102 is equal to 9.

The first accumulator 101 is configured to add one on a basis of the quantity of second code blocks buffered in the first buffer (D1) 102, to obtain the first accumulated value. "Adding one" means that one is added to the buffered quantity. For example, if the quantity buffered in the first buffer (D1) 102 is 9, the first accumulated value obtained after one is added is equal to 10.

The first buffer (D1) 102 is configured to update the previously buffered quantity of second code blocks by using the first accumulated value. For example, after the first accumulated value=10 is calculated, 9 previously buffered in the first buffer (D1) 102 is updated by using 10.

The second buffer (D2) 202 is configured to buffer the quantity of second indications generated when the first decoder decodes the code blocks preceding the first code block. The second indication is an indication of the turn-off state. If 0 or 1 is used as an indication, the quantity indicated herein is a quantity of 1. If the first decoder outputs five indications that are 1, the quantity of second indications buffered in the second buffer (D2) 202 is equal to 5.

The second accumulator 201 is configured to add one on a basis of the quantity of second indications buffered in the second buffer, to obtain the second accumulated value. For example, if the quantity buffered in the second buffer (D2) 202 is 5, the second accumulated value obtained after one is added is equal to 6.

The second buffer (D2) 202 is configured to update the previously buffered quantity of second indications by using the second accumulated value. For example, after the second accumulated value=6 is calculated, 5 previously buffered in the second buffer (D2) 202 is updated by using 6.

The decider 103 may transfer the first accumulated value to the multiplier 203, and the multiplier 203 divides the second accumulated value by the first accumulated value, to obtain the first turn-off probability p. Usually, both the first buffer (D1) 102 and the second buffer (D2) are periodically cleared, and the calculation of the first accumulated value and the second accumulated value is also usually calculated through accumulation in a periodicity. One periodicity is referred to as one time window in this embodiment of this application. A reciprocal of a time window may also be configured in the multiplier. For example, if 10 is used as a time window, $\frac{1}{10}$ may be configured in the multiplier, so that the decider 103 may not need to transfer the first accumulated value to the multiplier. Instead, the second accumulator calculates the second accumulated value=6, and obtains $6 \times \frac{1}{10} = 0.6$, which is the same as a result of dividing the second accumulated value 6 by the first accumulated value 10 in the example.

The decider 103 is configured to determine, based on the first accumulated value obtained by the first accumulator, whether the time window is reached. If the time window is 10, when it is determined, based on the first accumulated value, that a time length also reaches 10, it is considered that the time window is reached, that is, one periodicity is reached.

The turn-off probability calculator 204 is configured to determine the second turn-off probability p* based on the first turn-off probability p and the turn-off probability interval δp when the decider 103 determines that the time window is reached. The decider 103 triggers the turn-off probability calculator 204 to calculate p* once only when the time window is reached. In this way, system fluctuation caused by frequent replacement of p* is avoided, and energy consumption in calculation can also be reduced.

The turn-off probability calculator 204 may determine, based on a threshold range of the first turn-off probability p, a relational expression between p and δp corresponding to the second turn-off probability p*, and determine, based on the relational expression, the second turn-off probability p* corresponding to the first turn-off probability p. There is a function relationship p*=f(p, δp) between p* and p and δp. The function relationship may be preconfigured based on a requirement. For example, a relational expression of the function relationship may be configured as:

$$p^* = \begin{cases} p - \lceil p - \delta p \rceil \times cfg \cdot p_1, & p < cfg \cdot p_{th_1} \\ \ldots \\ p - \lceil p - \delta p \rceil \times cfg \cdot p_n, & p < cfg \cdot p_{th_n} \\ p, & \text{others} \end{cases} \quad (1)$$

where p represents the first turn-off probability, p* represents the second turn-off probability, by represents the turn-off probability interval, $cfg \cdot p_1$ to $cfg \cdot p_n$ represent different probability tracking steps, and $cfg \cdot p_{th_1}$ to $cfg \cdot p_{th_n}$ represent decision thresholds for different probability tracking steps.

Figure 5:
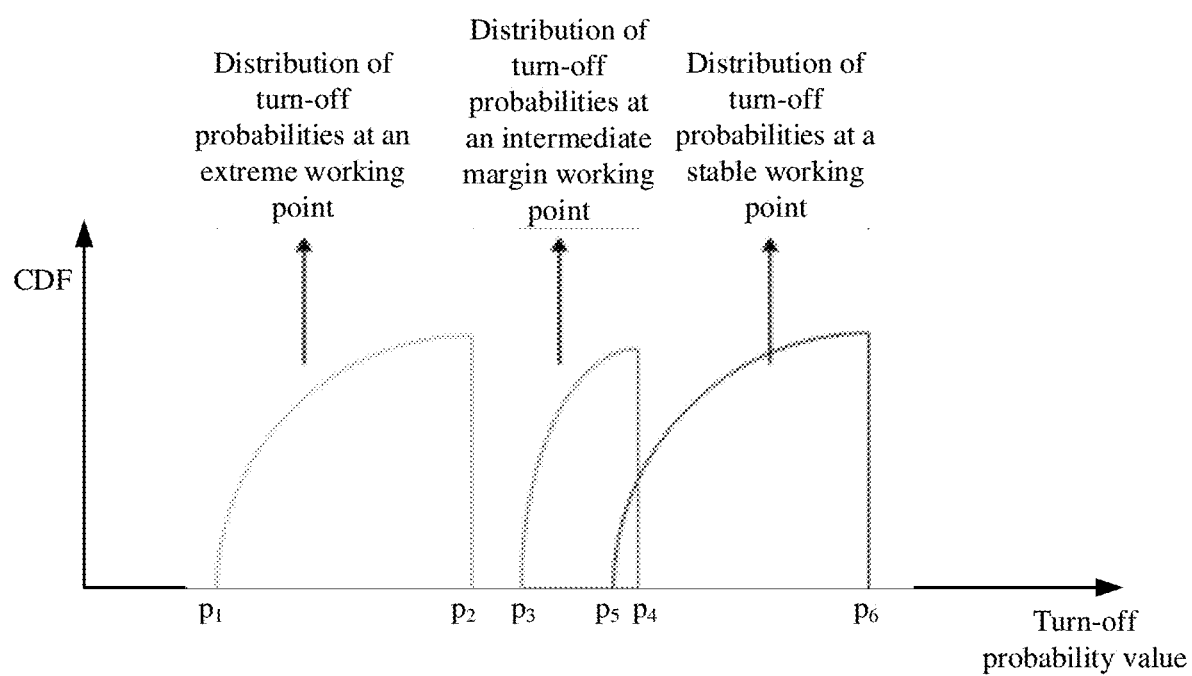
FIG. 5 is a schematic diagram of turn-off probability distribution in different working states according to an embodiment of this application.

For ease of describing the foregoing relational expression (1), the following describes the relational expression with reference to an example in FIG. 5. FIG. 5 is a schematic diagram of turn-off probability distribution in different working states according to an embodiment of this application. As shown in FIG. 5, the schematic diagram includes: distribution of turn-off probabilities at the extreme working point, distribution of turn-off probabilities at an intermediate margin working point, and distribution of turn-off probabilities at the stable working point. When the decoder jumps between the extreme working point and the stable working point, the decoder usually does not jump directly from the extreme working point to the stable working point, but first jumps from the extreme working point to the intermediate margin working point, and then jumps from the intermediate margin working point to the stable working point. The intermediate margin working point is any possible working point between the stable working point and the extreme working point.

In FIG. 5, a horizontal axis represents a turn-off probability value, and a vertical axis represents a cumulative distribution function (cumulative distribution function, CDF). On the horizontal axis, p1 indicates a minimum turn-off probability at the extreme working point, p2 indicates a maximum turn-off probability at the extreme working point, p3 indicates a minimum turn-off probability at the intermediate margin working point, p4 indicates a maximum turn-off probability at the intermediate margin working point, p5 indicates a minimum turn-off probability at the stable working point, and p6 indicates a maximum turn-off probability at the stable working point.

As can be learned from FIG. 5, when the decoder works at the extreme working point, the turn-off probability is lowest, but power consumption is highest. The turn-off probability of the decoder at the extreme working point is close to (p1+p2)/2, the turn-off probability of the decoder at the intermediate margin working point is close to (p3+p4)/2, and the turn-off probability of the decoder at the stable working point is close to (p5+p6)/2. Apparently, ((p3+p4)−(p1+p2))/2»((p5+p6)−(p3+p4))/2, and this causes largest power consumption fluctuation when the decoder jumps from the extreme working point to the intermediate margin working point. Consequently, more core voltage headroom needs to be reserved for working of the decoder, and the power consumption increases.

To ensure that no power consumption at the extreme working point and the stable working point is lost, while power consumption at the intermediate margin working point is reduced, for the case shown in FIG. 5, configuration parameters in f(p, δp) may be configured as follows:

$cfg \cdot p_1 = cfg \cdot p_2 = cfg \cdot p_3 = 0$ $cfg \cdot p_4 = \alpha (0 \le \alpha \le 1)$ $cfg \cdot p_5 = cfg \cdot p_6 = 0$ $cfg \cdot p_{th} = [p_1, \ldots, p_n] \quad (2)$ where $cfg \cdot p_1$ to $cfg \cdot p_6$ represent different probability tracking steps, α is a constant, and $cfg \cdot p_{th}$ represents a decision threshold for different probability tracking steps.

Because α is a constant and can be set or flexibly adjusted, the turn-off probability at the intermediate margin working point can be adjusted by setting α. In this way, fluctuation in power consumption of the decoder can be adjusted when the decoder jumps from the extreme working point to the intermediate margin working point. Similarly, values of parameters in the formula (2) can also be set or flexibly adjusted. Therefore, the values of the parameters in the formula (2) can be set or flexibly adjusted to adjust a result of p* in the formula (1). In this way, the turn-off probability of the decoder is effectively adjusted, and an effect of reducing fluctuation in power consumption of the decoder is achieved.

The probability buffer 205 is configured to buffer the second turn-off probability p* in the time window.

The comparator 206 is configured to compare the second turn-off probability p* with a random number. The random number is a number randomly generated by the comparator, and a value of the random number in this application ranges from 0 to 1. Alternatively, the random number in the comparator may be a random number sequence preconfigured and randomly selected by the comparator. Alternatively, a random number generation rule may be preconfigured in the comparator, and the comparator randomly generates the random number.

When the comparator compares that p* is greater than the random number, the selector 207 is configured to generate the third indication used to indicate the turn-off state. The third indication used to indicate the turn-off state is generated and output only when p* is greater than the random number. This avoids rapid fluctuation caused by immediate turn-off of the second decoder when the first decoder outputs the second indication used to indicate the turn-off state, and effectively mitigates fluctuation in power consumption of the decoder (the chip of the decoder).

When the comparator compares that p* is less than the random number, the selector 207 is configured to generate the third indication used to indicate the non-turn-off state. The third indication used to indicate the turn-off state is generated and output only when p* is greater than the random number. When the third indication indicates the non-turn-off state, it indicates that the second decoder should not be turned off currently. This can prevent decoding precision from being affected by incorrect turn-off of the second decoder when reliability of the turn-off state in the second indication is not high.

In this application, the decoding controller is added between decoders, so that power consumption of the decoder (the chip of the decoder) does not change dramatically with slight channel fluctuation of the decoder. The following uses a comparison between a turn-off solution of the decoding controller in this application in FIG. 6 and a conventional hard turn-off solution to understand an effect of the solution of this application.

Figure 6:
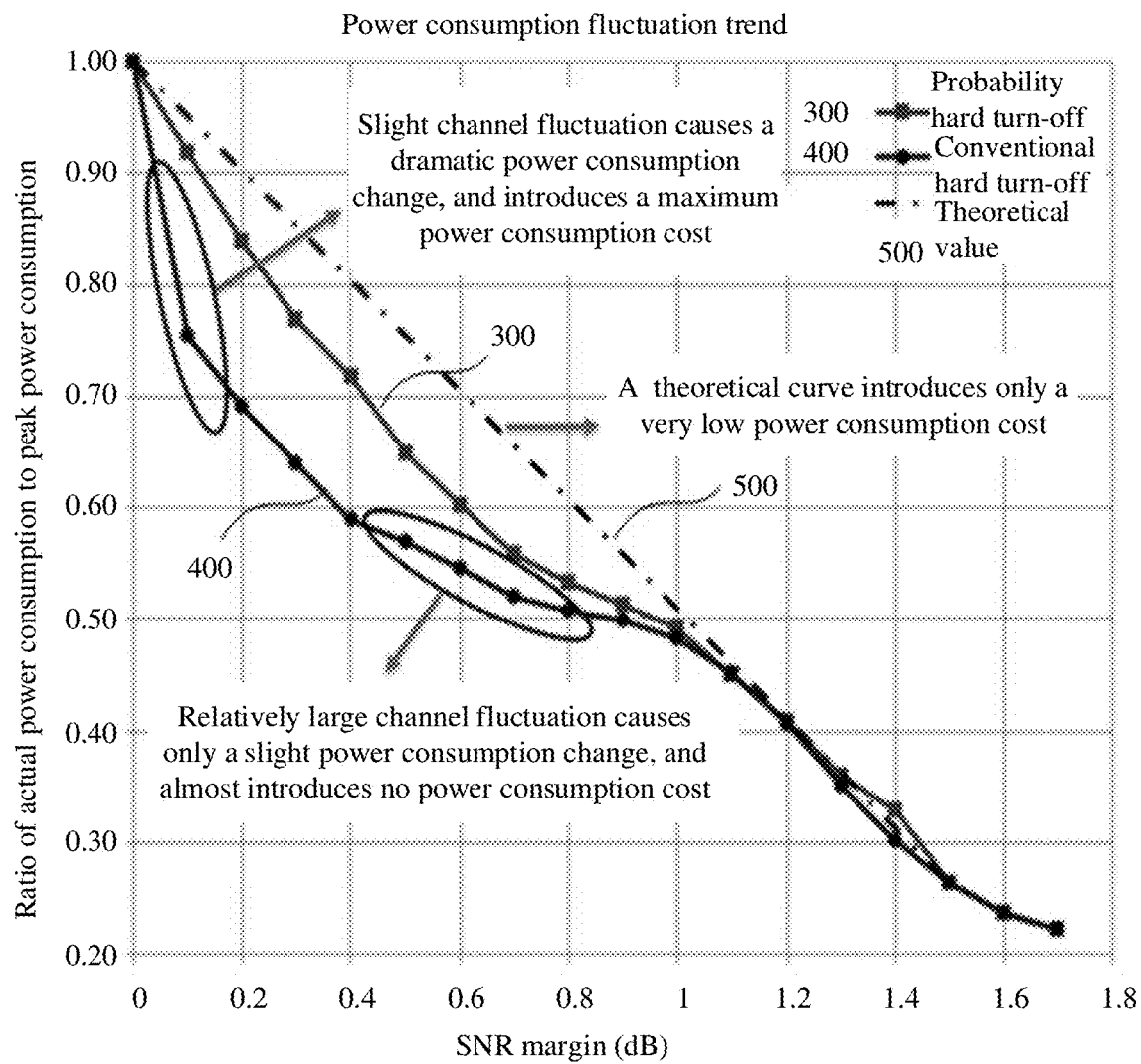
FIG. 6 is a schematic diagram of a power consumption fluctuation comparison according to an embodiment of this application.

As shown in FIG. 6, it can be learned from a comparison between a curve 300 and a curve 400 that a power consumption fluctuation trend according to the turn-off solution of the decoding controller in this application is smoother than that in the conventional hard turn-off solution, and is closer to a theoretical curve 500. Apparently, according to the turn-off solution of this application, power consumption of the decoder (the chip of the decoder) does not change dramatically with slight channel fluctuation. Therefore, core voltage headroom reserved for working of the chip is reduced, power consumption of the chip is reduced, and a service life of the chip is prolonged.

The foregoing describes the decoding system. The following describes a decoding controller in an embodiment of this application.

The decoding controller includes a receiving unit, a statistics unit, a probability calculation unit, an indication generation unit, and a sending unit.

The receiving unit is configured to receive a first indication and a second indication, where the first indication is used to indicate a non-turn-off state, the second indication is generated when a first decoder successfully decodes a first code block, and the second indication is used to indicate a turn-off state.

The statistics unit determines a first turn-off probability p based on the second indication and a quantity of second indications generated when the first decoder decodes code blocks preceding the first code block.

The probability calculation unit determines a second turn-off probability p* based on the first turn-off probability p and a turn-off probability interval δp, where the turn-off probability interval δp is obtained in advance by using a turn-off probability at a stable working point and a turn-off probability at an extreme working point.

The indication generation unit generates, based on the second turn-off probability p*, a third indication used to indicate the turn-off state or the non-turn-off state.

The sending unit is configured to send the third indication, where the third indication is used by a second decoder to process the second code block.

The statistics unit includes the first statistics module and the second statistics module in the embodiment corresponding to FIG. 4. The first statistics module includes a first accumulator and a first buffer. The second statistics module includes a second accumulator, a second buffer, and a multiplier. The probability calculation unit includes the turn-off probability calculator in the embodiment corresponding to FIG. 4. The decoding controller further includes the decider and the probability buffer in the embodiment corresponding to FIG. 4. The indication generation unit includes the comparator and the selector in the embodiment corresponding to FIG. 4. For functions of each module and each component, refer to corresponding descriptions in the foregoing embodiment for understanding. Details are not described herein again.

The foregoing describes the decoding system and the decoding controller from a perspective of a circuit. The decoding controller provided in this embodiment of this application is hereinafter described from a perspective of software.

II. Solution Implemented in the Software Manner.

Figure 7:
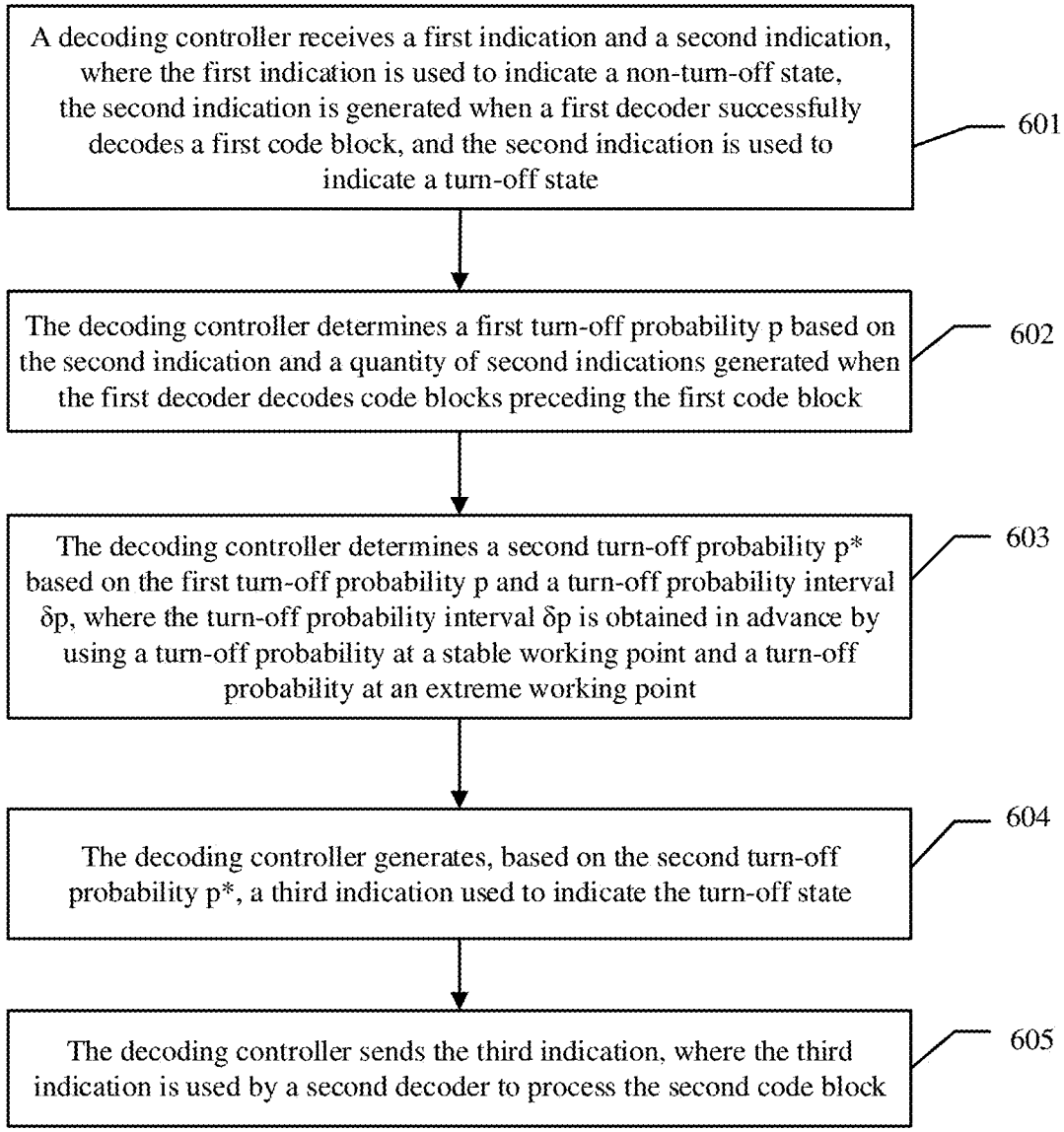
FIG. 7 is a schematic diagram of an embodiment of a decoding control method according to an embodiment of this application.

From the perspective of software, the decoding controller provided in this embodiment of this application may perform the following decoding control method. The method is applied to the decoding system described in the foregoing embodiment. For a specific structure of the decoding system, refer to FIG. 2 and FIG. 3 for understanding. With reference to FIG. 7, the following describes the decoding control method provided in this embodiment of this application.

As shown in FIG. 7, an embodiment of the decoding control method provided in this embodiment of this application includes the following steps.

601. A decoding controller receives a first indication and a second indication, where the first indication is used to indicate a non-turn-off state, the second indication is generated when a first decoder successfully decodes a first code block, and the second indication is used to indicate a turn-off state.

602. The decoding controller determines a first turn-off probability p based on the second indication and a quantity of second indications generated when the first decoder decodes code blocks preceding the first code block.

603. The decoding controller determines a second turn-off probability p* based on the first turn-off probability p and a turn-off probability interval δp, where the turn-off probability interval δp is obtained in advance by using a turn-off probability at a stable working point and a turn-off probability at an extreme working point.

604. The decoding controller generates, based on the second turn-off probability p*, a third indication used to indicate the turn-off state or the non-turn-off state.

605. The decoding controller sends the third indication, where the third indication is used by a second decoder to process the second code block.

In the solution provided in this embodiment of this application, after the first decoder determines that the first code block is successfully decoded, the decoding controller determines the second turn-off probability p* with reference to the first turn-off probability p and δp, and determines, based on p*, whether to indicate turn-off of the second decoder, even if the third indication indicates the turn-off state. This is equivalent to adding a buffer zone between the two adjacent decoders. Therefore, a turn-off indication output by a previous-stage decoder is prevented from being immediately effective on a next-stage decoder, and rapid fluctuation in power consumption of the decoder (a chip of the decoder) is mitigated. In addition, when the third indication indicates the non-turn-off state, it indicates that the second decoder should not be turned off currently. This can prevent decoding precision from being affected by incorrect turn-off of the second decoder when reliability of the turn-off state in the second indication is not high.

Optionally, step 602 includes: The decoding controller monitors outputting of the second code block by the first decoder, and adds one on a basis of a quantity of second code blocks that are output after the first decoder decodes the code blocks preceding the first code block, to obtain a first accumulated value; and the decoding controller adds one on a basis of the quantity of second indications generated when the first decoder decodes the code blocks preceding the first code block, to obtain a second accumulated value, and determines the first turn-off probability p based on the first accumulated value and the second accumulated value, where the second accumulated value is not greater than the first accumulated value.

Optionally, the decoding control method further includes: The decoding controller updates the quantity of second indications by using the second accumulated value.

Optionally, the decoding control method further includes: The decoding controller determines, based on the first accumulated value, whether a time window is reached; and that the decoding controller determines a second turn-off probability p* based on the first turn-off probability p and a turn-off probability interval δp includes: The decoding controller determines the second turn-off probability p* based on the first turn-off probability p and the turn-off probability interval δp when determining that the time window is reached.

Optionally, the step in which the decoding controller determines the second turn-off probability p* based on the first turn-off probability p and the turn-off probability interval δp when determining that the time window is reached includes: When determining that the time window is reached, the decoding controller determines, based on a threshold range of the first turn-off probability p, a relational expression between p and δp corresponding to the second turn-off probability p*, and determines, based on the relational expression, the second turn-off probability p* corresponding to the first turn-off probability p.

Optionally, the decoding control method further includes: The decoding controller buffers the second turn-off probability p* in the time window.

Optionally, the step in which the decoding controller generates, based on the second turn-off probability p*, the third indication used to indicate the turn-off state or the non-turn-off state includes: The decoding controller compares the second turn-off probability p* with a random number; and when comparing that p* is greater than the random number, the decoding controller generates the third indication used to indicate the turn-off state, or when comparing that p* is less than the random number, generates the third indication used to indicate the non-turn-off state.

For descriptions and ideas of related features in the decoding control method, refer to corresponding content corresponding to FIG. 4 to FIG. 6 for understanding. Details are not described herein again.

With reference to the foregoing decoding control method, an embodiment of this application further provides a corresponding decoding controller. The decoding controller is also applied to the foregoing decoding system. The following describes the decoding controller with reference to FIG. 8.

Figure 8:
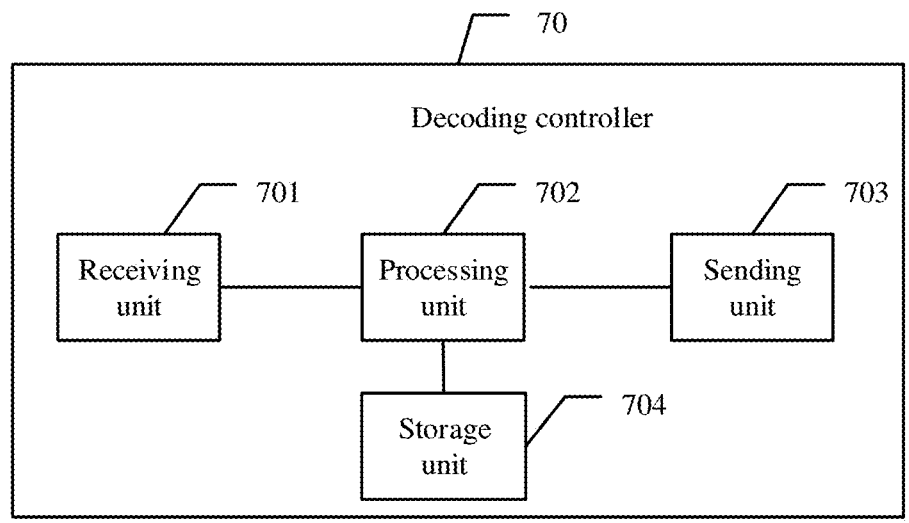
FIG. 8 is a schematic diagram of another structure of a decoding controller according to an embodiment of this application.

FIG. 8 is a schematic diagram of an embodiment of a decoding controller according to an embodiment of this application. As shown in FIG. 8, an embodiment of the decoding controller 70 provided in this embodiment of this application includes a receiving unit 701, a processing unit 702, a sending unit 703, and a storage unit 704.

The receiving unit 701 is configured to receive a first indication and a second indication, where the first indication is used to indicate a non-turn-off state, the second indication is generated when a first decoder successfully decodes a first code block, and the second indication is used to indicate a turn-off state.

The processing unit 702 is configured to determine a first turn-off probability p based on the second indication and a quantity of second indications generated when the first decoder decodes code blocks preceding the first code block, determine a second turn-off probability p* based on the first turn-off probability p and a turn-off probability interval δp, where the turn-off probability interval δp is obtained in advance by using a turn-off probability at a stable working point and a turn-off probability at an extreme working point, and generate, based on the second turn-off probability p*, a third indication used to indicate the turn-off state or the non-turn-off state.

The sending unit 703 is configured to send the third indication, where the third indication is used by a second decoder to process the second code block.

Optionally, the processing unit 702 is configured to: monitor outputting of the second code block by the first decoder, and add one on a basis of a quantity of second code blocks that are output after the first decoder decodes the code blocks preceding the first code block, to obtain a first accumulated value; and add one on a basis of the quantity of second indications generated when the first decoder decodes the code blocks preceding the first code block, to obtain a second accumulated value, and determine the first turn-off probability p based on the first accumulated value and the second accumulated value, where the second accumulated value is not greater than the first accumulated value.

Optionally, the processing unit 702 is further configured to update the quantity of second code blocks by using the first accumulated value.

Optionally, the processing unit 702 is further configured to update the quantity of second indications by using the second accumulated value.

Optionally, the processing unit 702 is further configured to determine, based on the first accumulated value, whether a time window is reached; and determine the second turn-off probability p* based on the first turn-off probability p and the turn-off probability interval δp when determining that the time window is reached.

Optionally, when determining that the time window is reached, the processing unit 702 is configured to determine, based on a threshold range of the first turn-off probability p, a relational expression between p and δp corresponding to the second turn-off probability p*, and determine, based on the relational expression, the second turn-off probability p* corresponding to the first turn-off probability p.

Optionally, the storage unit 704 is configured to buffer the second turn-off probability p* in the time window.

Optionally, the processing unit 702 is configured to: compare the second turn-off probability p* with a random number; and when comparing that p* is greater than the random number, generate the third indication used to indicate the turn-off state, or when comparing that p* is less than the random number, generate the third indication used to indicate the non-turn-off state.

For descriptions and ideas of related features in the decoding controller herein, refer to corresponding content corresponding to FIG. 1 to FIG. 6 for understanding. Details are not described herein again.

Figure 9:
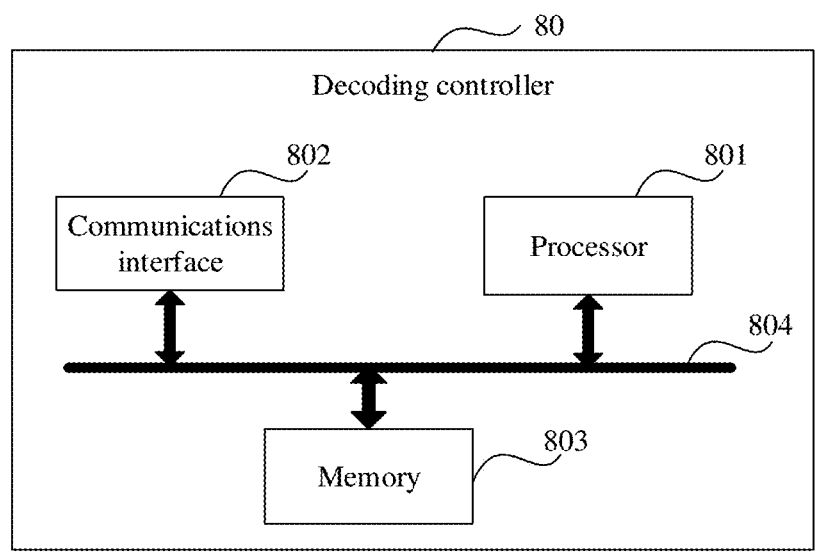
FIG. 9 is a schematic diagram of another structure of a decoding controller according to an embodiment of this application.

FIG. 9 shows a decoding controller in the foregoing embodiment according to an embodiment of this application. The decoding controller 80 includes a processor 801, a communications interface 802, a memory 803, and a bus 804. The processor 801, the communications interface 802, and the memory 803 are connected to each other by using the bus 804. In this embodiment of this application, the processor 801 is configured to process an action of the decoding controller 80. For example, the processor 801 is configured to perform steps 602 to 604 in FIG. 7, and/or is configured to perform another process of the technology described in this specification. The communications interface 802 is configured to support the decoding controller 80 in communication. The memory 803 is configured to store program code and data of the decoding controller 80.

The processor 801 may be a central processing unit, a general-purpose processor, a digital signal processor, an application-specific integrated circuit, a field programmable gate array or another programmable logic device, a transistor logic device, a hardware component, or any combination thereof. The processor 801 may implement or execute various example logical blocks, modules, and circuits described with reference to content disclosed in this application. Alternatively, the processor may be a combination of processors implementing a computing function, for example, a combination including one or more microprocessors, or a combination of a digital signal processor and a microprocessor. The bus 804 may be a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 9, but this does not mean that there is only one bus or only one type of bus.

This application further provides a system-on-chip, where the system-on-chip includes a processor configured to support a decoding controller in implementing functions in any one of the third aspect or the possible implementations of the third aspect. In a possible design, the system-on-chip may further include a memory, where the memory is configured to store program instructions and data required by the decoding controller. The system-on-chip may include a chip, or may include a chip and another discrete component.

Another embodiment of this application further provides a computer-readable storage medium. The computer-readable storage medium stores computer-executable instructions. When at least one processor of a device executes the computer-executable instructions, the device performs the method described in the embodiment in FIG. 7.

Another embodiment of this application further provides a computer program product. The computer program product includes computer-executable instructions, and the computer-executable instructions are stored in a computer-readable storage medium. At least one processor of a device can read the computer-executable instructions from the computer-readable storage medium, and the at least one processor executes the computer-executable instructions, so that the device performs the method described in the embodiment in FIG. 7.

A person of ordinary skill in the art may be aware that, in combination with the examples described in embodiments disclosed in this specification, units and algorithm steps can be implemented by electronic hardware or a combination of computer software and electronic hardware. Whether the functions are executed by hardware or software depends on particular applications and design constraints of the technical solutions. A person skilled in the art may use different methods to implement the described functions for each particular application, but it should not be considered that the implementation goes beyond the scope of embodiments of this application.

A person skilled in the art may clearly understand that, for the purpose of convenient and brief description, for detailed working processes of the foregoing systems, apparatuses, and units, refer to corresponding processes in the foregoing method embodiments. Details are not described herein again.

In the several embodiments provided in embodiments of this application, it should be understood that the disclosed system, apparatus, and method may be implemented in other manners. For example, the foregoing apparatus embodiments are merely examples. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or the units may be implemented in electrical, mechanical, or other similar forms.

The units described as separate components may or may not be physically separate, and components displayed as units may or may not be physical units. To be specific, the components may be located at one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of embodiments of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods in embodiments of this application. The foregoing storage medium includes any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementations of embodiments of this application, but are not intended to limit the protection scope of embodiments of this application. Any variation or replacement readily figured out by a person skilled in the art within the technical scope disclosed in embodiments of this application shall fall within the protection scope of embodiments of this application. Therefore, the protection scope of embodiments of this application shall be subject to the protection scope of the claims.

What is claimed is:

1. A system comprising: at least two decoders and a decoding controller disposed between two adjacent decoders of the at least two decoders, wherein the two adjacent decoders comprise a first decoder and a second decoder; and wherein
the first decoder is configured to:
  receive a first indication and a first code block, wherein the first indication indicates a non-turn-off state, which indicates the first decoder to decode the first code block;
  when the first code block is successfully decoded, generate a second indication indicating a turn-off state, the turn-off state indicating that the first code block is successfully decoded by the first decoder; and
  output the second indication and a second code block that is obtained after the first code block is successfully decoded;
the decoding controller is configured to:
  receive the first indication and the second indication;
  determine a first turn-off probability p of the first decoder based on the second indication and a quantity of second indications that have been generated by the first decoder when the first decoder decodes code blocks preceding the first code block, the first turn-off probability p indicating a probability of successful decoding of the code blocks by the first decoder;
  determine a second turn-off probability p* based on the first turn-off probability p and a turn-off probability interval δp, wherein the turn-off probability interval δp is pre-obtained based on a turn-off probability of the first decoder operating at a stable working point and a turn-off probability of the first decoder operating at an extreme working point; and
  generate, based on the second turn-off probability p*, a third indication indicating the turn-off state or the non-turn-off state; and
the second decoder is configured to receive the third indication and the second code block, and process the second code block based on the third indication.

2. The system according to claim 1, wherein the decoding controller is configured to:
  monitor outputting of the second code block by the first decoder, and add one (1) to a quantity of second code blocks that are output by the first decoder after the first decoder decodes the code blocks preceding the first code block, to obtain a first accumulated value; and
  add one (1) to the quantity of second indications generated when the first decoder decodes the code blocks preceding the first code block, to obtain a second accumulated value, and determine the first turn-off probability p based on the first accumulated value and the second accumulated value, wherein the second accumulated value is not greater than the first accumulated value.

3. The system according to claim 2, wherein the decoding controller comprises a first accumulator and a first buffer, and wherein
  the first buffer is configured to buffer the quantity of second code blocks;
  the first accumulator is configured to add one to the quantity of second code blocks buffered in the first buffer, to obtain the first accumulated value; and
  the first buffer is configured to update the quantity of second code blocks using the first accumulated value.

4. The system according to claim 2, wherein the decoding controller comprises a second accumulator, a second buffer, and a multiplier, wherein
  the second buffer is configured to buffer the quantity of second indications;
  the second accumulator is configured to add one to the quantity of second indications buffered in the second buffer, to obtain the second accumulated value;
  the second buffer is configured to update the quantity of second indications using the second accumulated value; and
  the multiplier is configured to divide the second accumulated value by the first accumulated value to obtain the first turn-off probability p.

5. The system according to claim 2, wherein the decoding controller is further configured to:
  determine, based on the first accumulated value obtained by the first accumulator, whether a time window is reached; and
  determine the second turn-off probability p* based on the first turn-off probability p and the turn-off probability interval δp when the time window is reached.

6. The system according to claim 5, wherein the decoding controller is further configured to:
  when the time window is reached, determine, based on a threshold range of the first turn-off probability p, a relational expression between p and δp corresponding to the second turn-off probability p*, and determine, based on the relational expression, the second turn-off probability p* corresponding to the first turn-off probability p.

7. The system according to claim 5, wherein the decoding controller further comprises a probability buffer configured to buffer the second turn-off probability p* in the time window.

8. The system according to claim 5, wherein the decoding controller is further configured to:
  compare the second turn-off probability p* with a random number; and
  when p* is greater than the random number, generate the third indication indicating the turn-off state, or when p* is less than the random number, generate the third indication indicating the non-turn-off state.

9. A decoding controller, applied to a decoding system, wherein the decoding system comprises at least two decoders the decoding controller is disposed between two adjacent decoders of the at least two decoders, the two adjacent decoders comprise a first decoder and a second decoder, and the decoding controller comprises a processor and a communication interface, wherein the processor is configured to:

receive, using the communication interface, a first indication and a second indication, wherein the first indication indicates a non-turn-off state, which indicates the first decoder to decode a first code block, the second indication is generated by the first decoder and indicates a turn-off state, the turn-off state indicating that the first code block is successfully decoded by the first decoder;

determine a first turn-off probability p based on the second indication and a quantity of second indications that have been generated by the first decoder when the first decoder decodes code blocks preceding the first code block, the first turn-off probability p indicating a probability of successful decoding of the code blocks by the first decoder;

determine a second turn-off probability p* based on the first turn-off probability p and a turn-off probability interval δp, wherein the turn-off probability interval δp is pre-obtained based on a turn-off probability of the first decoder operating at a stable working point and a turn-off probability of the first decoder operating at an extreme working point;

generate, based on the second turn-off probability p*, a third indication indicating the turn-off state or the non-turn-off state; and send, using the communication interface, the third indication to the second decoder for the second decoder to use to process a second code block that is obtained based on successful decoding of the first code block.

10. The decoding controller according to claim 9, wherein the processor is further configured to:

monitor outputting of the second code block by the first decoder, and add one (1) to a quantity of second code blocks that are output by the first decoder after the first decoder decodes the code blocks preceding the first code block, to obtain a first accumulated value; and add one (1) to the quantity of second indications generated when the first decoder decodes the code blocks preceding the first code block, to obtain a second accumulated value, and determine the first turn-off probability p based on the first accumulated value and the second accumulated value, wherein the second accumulated value is not greater than the first accumulated value.

11. The decoding controller according to claim 10, wherein the decoding controller comprises a first accumulator and a first buffer, wherein the first buffer is configured to buffer the quantity of second code blocks;

the first accumulator is configured to add one to the quantity of second code blocks buffered in the first buffer, to obtain the first accumulated value; and the first buffer is configured to update the quantity of second code blocks using the first accumulated value.

12. The decoding controller according to claim 10, wherein the decoding controller comprises a second accumulator, a second buffer, and a multiplier, wherein the second buffer is configured to buffer the quantity of second indications;

the second accumulator is configured to add one to the quantity of second indications buffered in the second buffer, to obtain the second accumulated value;

the second buffer is configured to update the quantity of second indications using the second accumulated value; and the multiplier is configured to divide the second accumulated value by the first accumulated value to obtain the first turn-off probability p.

13. The decoding controller according to claim 10, wherein the processor is further configured to:

determine, based on the first accumulated value obtained by the first accumulator, whether a time window is reached; and determine the second turn-off probability p* based on the first turn-off probability p and the turn-off probability interval δp when the time window is reached.

14. The decoding controller according to claim 13, wherein the processor is further configured to:

when the time window is reached, determine, based on a threshold range of the first turn-off probability p, a relational expression between p and δp corresponding to the second turn-off probability p*, and determine, based on the relational expression, the second turn-off probability p* corresponding to the first turn-off probability p.

15. The decoding controller according to claim 13, wherein the decoding controller further comprises a probability buffer configured to buffer the second turn-off probability p* in the time window.

16. The decoding controller according to claim 13, wherein the processor is further configured to:

compare the second turn-off probability p* with a random number; and when p* is greater than the random number, generate the third indication indicating the turn-off state, or when p* is less than the random number, generate the third indication indicating the non-turn-off state.

17. A method applied to a decoding system, the decoding system comprises at least two decoders and a decoding controller disposed between two adjacent decoders of the at least two decoders, and the two adjacent decoders comprise a first decoder and a second decoder, and the method comprises:

receiving, by the decoding controller, a first indication and a second indication, wherein the first indication indicates a non-turn-off state, which indicates the first decoder to decode a first code block, and the second indication is generated by the first decoder and indicates a turn-off state, the turn-off state indicating that the first code block is successfully decoded by the first decoder;

determining, by the decoding controller, a first turn-off probability p based on the second indication and a quantity of second indications generated by the first decoder when the first decoder decodes code blocks preceding the first code block, the first turn-off probability p indicating a probability of successful decoding of the code blocks by the first decoder;

determining, by the decoding controller, a second turn-off probability p* based on the first turn-off probability p and a turn-off probability interval δp, wherein the turn-off probability interval δp is pre-obtained based on a turn-off probability of the first decoder operating at a stable working point and a turn-off probability of the first decoder operating at an extreme working point;

generating, by the decoding controller based on the second turn-off probability p*, a third indication indicating the turn-off state or the non-turn-off state; and sending, by the decoding controller, the third indication to the second decoder for the second decoder to use to process a second code block that is obtained based on successful decoding of the first code block.

18. The method according to claim 17, further comprising:

monitoring, by the decoding controller, outputting of the second code block by the first decoder;

adding one (1) to a quantity of second code blocks that are output by the first decoder after the first decoder decodes the code blocks preceding the first code block, to obtain a first accumulated value;

adding one (1) to the quantity of second indications generated when the first decoder decodes the code blocks preceding the first code block, to obtain a second accumulated value; and determining the first turn-off probability p based on the first accumulated value and the second accumulated value, wherein the second accumulated value is not greater than the first accumulated value.

19. The method according to claim 18, further comprising:

updating, by the decoding controller, the quantity of second code blocks using the first accumulated value.

20. The method according to claim 18, further comprising:

updating, by the decoding controller, the quantity of second indications using the second accumulated value.

* * * * *